United States Patent [19]

Ladany et al.

[11] Patent Number: 5,311,610
[45] Date of Patent: May 10, 1994

[54] LOW-STRESS COUPLING OF ELECTROOPTICAL DEVICE TO OPTICAL FIBER

[75] Inventors: Ivan Ladany, Harborton, Va.; Leslie A. Reith, Berkeley Heights, N.J.

[73] Assignee: Bell Communications Research, Inc., Livingston, N.J.

[21] Appl. No.: 41,027

[22] Filed: Mar. 31, 1993

[51] Int. Cl.$^5$ .............................................. G02B 6/36
[52] U.S. Cl. ....................................... 385/92; 385/93; 385/84
[58] Field of Search ................................... 385/88–94, 385/34, 33, 84, 140, 51

[56] References Cited

U.S. PATENT DOCUMENTS

| | | | |
|---|---|---|---|
| 5,048,919 | 9/1991 | Ladany | 385/49 |
| 5,175,783 | 12/1992 | Tatoh | 385/93 |
| 5,181,264 | 1/1993 | Chiaretti et al. | 385/34 |
| 5,216,737 | 6/1993 | Driessen et al. | 385/93 |

OTHER PUBLICATIONS

"Optical Components—The New Challenge in Packaging", M. Matthews, B. MacDonald, K. Preston, *IEEE Trans. Comp. Hybrids Manu. Tech.*, vol. 13, No. 4, Dec. 1990, pp. 798–806.
"A Stable Laster Module with UV-Curable Resin for Single-Mode Subscriber Use", M. Suzuki, T. Nakanishi, N. Tsuzuki, N. Murata, *Proc. 40th ECTC.*, vol. 1, 1990, pp. 200–205.
"Optical-Mechanical Considerations for Laser-Fiber Coupling and Packaging", *SPIE Proc., Int. Lens Design Conf.*, vol. 554, 1985, pp. 308–312.

*Primary Examiner*—Rodney B. Bovernick
*Assistant Examiner*—John Ngo
*Attorney, Agent, or Firm*—Leonard Charles Suchyta; Stephen M. Gurey

[57] ABSTRACT

An electrooptical device, such as a semiconductor laser, and an optical fiber are packaged together in light coupling alignment using an electrolytic technique that avoids heat-induced stresses that commonly result from joining methods that employ welding, soldering, or catalytic adhesive compositions. The particular technique of this invention also avoids the need to encapsulate the electrooptical device within an index matching gel to protect it from the electrolytic plating solution thereby enabling optical devices such as lenses, isolators, filters, etc, to be incorporated in the package. The electrooptical device is mounted onto a common metallic base and the optical device is mounted within the bore of a tubular metallic support member. This support member is affixed to the base by means of nodes of a flexible conductive gel and is positioned relative to the electrooptical device for maximum light coupling between the device and the optical fiber within the support member. A non-metallic bottomless container is disposed on the base over the support member and the nodes of conductive gel (but not over the electrooptical device) to form a liquid-tight interior region for containing a low-stress electrolytic plating solution. The base, the nodes of conductive gel and the portion of the fiber support member within the container form the cathode in a plating circuit and are plated together to fix the alignment of the device and the fiber at its optimum coupling position.

23 Claims, 2 Drawing Sheets

LOW-STRESS COUPLING OF ELECTROOPTICAL DEVICE TO OPTICAL FIBER

BACKGROUND OF THE INVENTION

This invention relates to a technique for permanently fixing the position of objects relative to one another, and specifically to a technique for permanently fixing single-mode optical fibers into position in optical device packages. More specifically, this invention relates to a technique for joining an optical fiber in a high efficiency coupling arrangement with an electrooptical device, such as a semiconductor laser, without the introduction of stresses that invariably result in element misalignment and degradation of coupling efficiency upon subsequent relaxation of such stress.

Alignment of single-mode fibers to optical devices such as lasers or laser amplifiers typically requires alignment tolerances of less than 1 $\mu$m for lensed fibers or $\pm 2$-5 $\mu$m if microoptics are used to couple light into the fiber. Regardless of the coupling scheme employed, however, maintaining fiber alignment both during and after the locking process is one of the most difficult, and hence, costly, parts of the packaging assembly process.

Standard locking techniques include epoxying, soldering, and laser welding (see, e.g., M. R. Matthews, B. M. Macdonald, and K. R. Preston, "Optical components—the new challenge in packaging, "*IEEE Trans. Comp., Hybrids, Manu. Tech.*, vol. 13, 1990, pp. 798–806, 1990; and J. Lipson, R. T. Ku, and R. E. Scotti, "Opto-mechanical considerations for laser-fiber coupling and packaging," *SPIE Proc., Int. Lens Design Conf.*, vol. 554, 1985, pp. 308–312). Each of these techniques has disadvantages. Adhesives are inexpensive, but long-term reliability has been a perennial concern both in terms of potential outgassing of organics, and stability over wide temperature ranges, despite recent progress (see, e.g., M. Suzuki, T. Nakanishi, N. Tzuzuki, and N. Murata, "A stable laser module with UV-curable resin for single-mode subscriber use," *Proc. 40th ECTC*, vol. 1, 1990, pp. 200–205). Solder has the potential to creep, and the high temperatures necessary during the soldering process make active fiber alignment difficult. Laser welding is regarded as having the best long-term stability, but it requires high-power lasers and careful control of a variety of parameters for reproducible results (see Matthews et al, above).

It is also difficult to avoid stress-related misalignments during the fixing process for any of these three techniques. Epoxy has been used most successfully for lens mounting, where only small amounts of epoxy (low strength bonds) are required. If fibers are epoxied, iterative techniques are required to overcome misalignments during the epoxy curing process. Soldering misalignments occur as the solder cools, often requiring rework. Laser welding is highly perturbative, and often requires a post-locking correction, such as bending the fiber tube that holds the fiber.

Electroplating a fiber into position has been found to have several advantages. It requires no special precision matching or expensive pieceparts, and no special equipment. Demonstrations have shown the process to be nonperturbative to at least 1 $\mu$m. In U.S. Pat. No. 5,048,919 issued on Sep. 17, 1991 to I. Ladany, coinventor herein, electroplating is shown to fix a single-mode fiber in place while coupled to a laser diode. As described in that patent, the laser is mounted inside a small copper tube, and the fiber, also mounted in a separate copper tube, is butt-coupled to the laser, while the space between the two is filled with an index-matching gel to prevent intrusion of the electrolytic solution during the plating process to the laser and the fiber end. The two copper tubes are then electrically connected by means of a conductive paint, immersed in a plating solution, and plated into a solid copper rod. This results in an extremely small package, with excellent electrical shielding. Disadvantageously, however, the index matching gel used to seal the ends of the two tubes precludes the use of lenses, optical isolators, filters, etc., which might be necessary or useful, depending on the particular application. For example, the higher coupling efficiencies between a laser and a fiber that are necessary for long distance transmission, and that could only be achieved by means of lenses between the laser and the fiber end, could not be achieved.

An object of the present invention is to provide a technique for fixing an object in position relative to some reference base using a low-stress inducing electroplating procedure.

A further object of the present invention is to provide a broad based technique for joining an optical fiber and any general electrooptical device in a high efficiency coupling arrangement using a low-stress inducing electroplating procedure.

A further object is to perform the technique of the invention in a manner that isolates the critical interface between the fiber and the electrooptical device from the plating solution during the electrolytic bonding process in such a way that it is unnecessary for the fiber end and the electrooptical device and its associated components to sit in a protective gel.

SUMMARY OF THE INVENTION

In accordance with a specific realization of the present invention, an electrooptical device is coupled to an optical fiber by mounting the electrooptical device onto a common metallic base (directly or by means of an intermediate chip carrier) and by mounting the optical fiber in the bore of a metallic tubular support member which itself is affixed to that same common metallic base. The fiber support member is initially loosely affixed to the base by means of a flexible conductive gel and positioned to obtain optimum light coupling alignment between the fiber and the device. Once the fiber support member is optimally positioned for maximum coupling efficiency, the conductive gel, the fiber and its support member, and the base (but not the optical device) are immersed in a plating solution, and together form the cathode in a plating circuit. An anode is inserted into the solution and electrical current is applied. As metal is deposited onto the cathode, a strong metal bridge is formed across the conductive gel, locking the metallic fiber support member and its enclosed optical fiber to the base.

In order to protect the electrooptical device from contamination by the plating solution during the electroplating process, a bottomless removable cylindrical container of teflon or other plastic or non-metallic material is used to hold the solution. Machined out of the cylindrical sidewall of the container at diametrically opposed radial positions in the container's bottom edge are two archways to enable the container to fit over the tubular support member holding the fiber, and yet sit firmly on or into the base. By sealing these archways with a nonconductive gel and the interfacing edge between the container and the base with vacuum grease, a liquid-tight receptacle for the plating solution is formed by the teflon cylindrical sidewall and the metallic base. After plating the fiber tube, the conductive gel, and the base, to form a strongly bonded integral unit, the plating solution is drained and the container removed. What remains is the electrooptical device coupled to the optical fiber within its protective metallic support member. By using a low-stress plating solution, the net motion of the fiber during the plating procedure can be substantially eliminated, thereby maintaining the same level of coupling between the fiber and the electrooptical device achieved at the beginning of the plating procedure. Since the electrooptical device has been protected from the plating solution, lenses, optical isolators, and/or optical filters can be incorporated in the electrooptical device/optical fiber package for maximum coupling efficiency and/or desired functionality.

DETAILED DESCRIPTION

Figure 1:
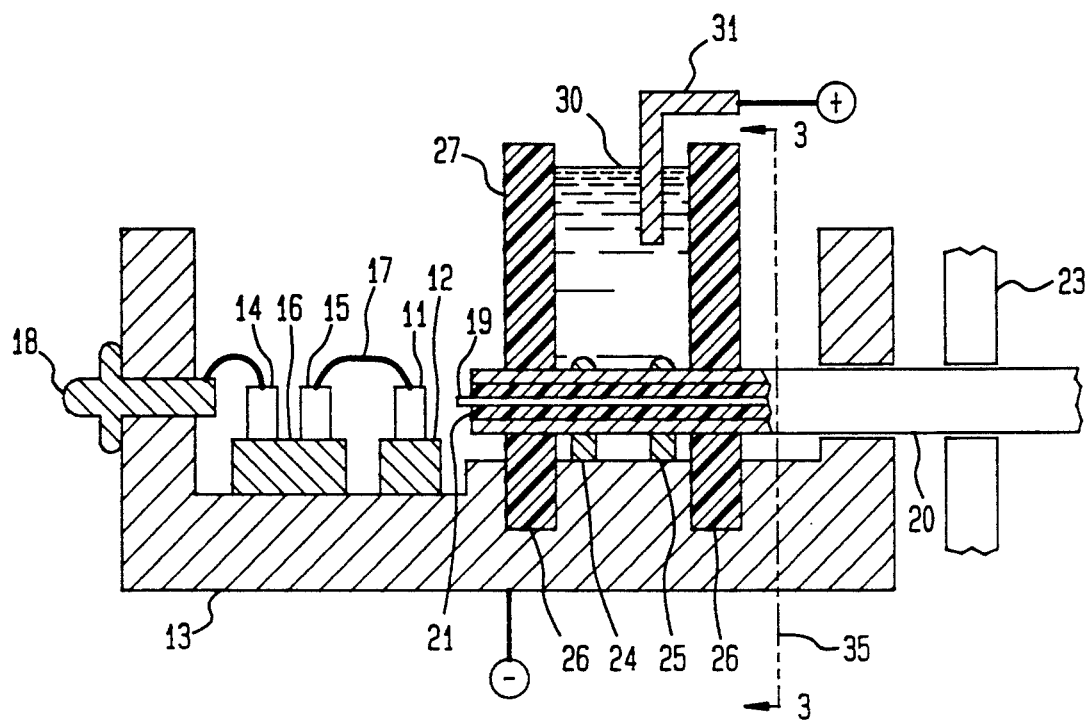
FIG. 1 is a partial cut-away view of the physical coupling arrangement between an electrooptical device and an optical fiber which uses electrolytic plating to effect bonding of a fiber support member to a common base, in accordance with the invention. This FIGURE shows the removable teflon container used to hold the plating solution during the plating process disposed in place over the fiber support member and on the base.
Figure 2:
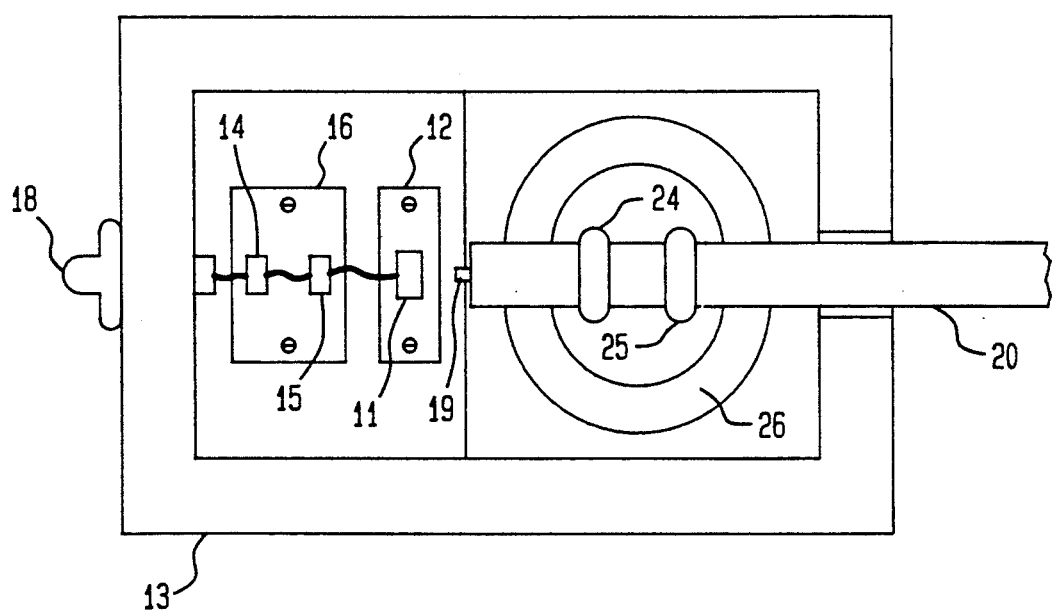
FIG. 2 is a top view of the arrangement of FIG. 1 in which the teflon plating solution container has been removed.
Figure 3:
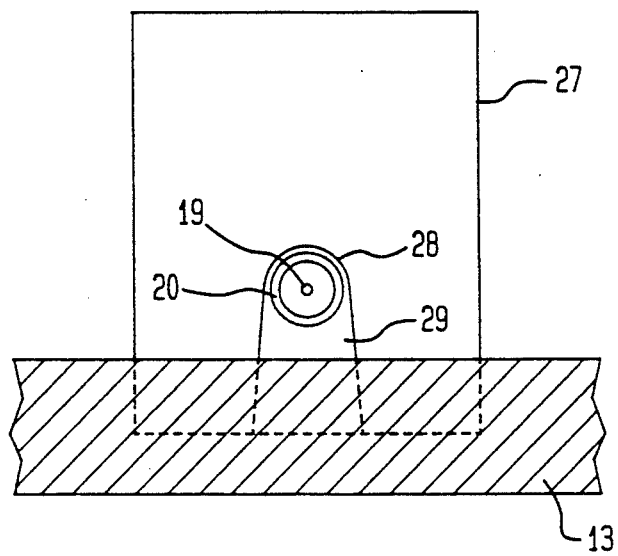
FIG. 3 is a side view of the arrangement of FIG. 1 from the perspective noted in FIG. 1, which shows one of the archways cut into the sidewall of the removable teflon plating solution container for receiving the fiber support member.

The same numerical designations have been given to elements common to FIGS. 1, 2 and 3. With reference to FIG. 1, an electrooptical device 11, such as a semiconductor laser, is affixed to a metallic chip carrier 12, which is then in turn screwed (shown in FIG. 2) onto a common metallic base 13. Chip carrier 12, which can be nickel-plated copper, serves as a heat sink for the electrooptical device 11. Base 13 can be copper or other electrically conductive metal. Also affixed to base 13 is input and output stage drive circuitry 14 and 15, respectively, mounted on carrier 16 and affixed to the base 13. Carriers 12 and 16 advantageously improve the connection of their associated devices together and to the base 13 but are not necessary for the present invention. A lead 17 connects the output stage 15 of the drive circuitry to the laser 11 and an SMA connector 18 provides the input to the input stage 14.

The optical fiber 19 to which laser 11 is coupled is mounted in the bore of a length of metallic tubing 20, preferably having high electrical conductivity, e.g. copper, nickel or the like, and the bore of the tube 20 is then filled with an epoxy 21 or solder to seal and fix the fiber 19 within the tube. A plated fiber could also be used rather than a fiber within the bore of a tube. For purposes of clarity, liberties have been taken in the Figure with the relative dimensions of the elements. The back-end of the fiber tube 20 is clamped and mounted to the insulated clamping arm 23 of a micropositioner (not shown) and the fiber end 22 is aligned in a light coupling arrangement with the laser 11. The tube 20 is affixed to the base 13 by means of two nodes, 24 and 25, of a flexible conductive stable organic gel-like material to form a physical and an electrical connection between the fiber tube 20 and the base 13. This conductive gel can be fabricated from a mixture of an uncured silicone dielectric base composition such as that which is obtainable as Sylgard 527 from Dow Corning Corporation, Midland, Mich., and 2-μm diameter graphite particles at a concentration level of 1.2–1.5 gm of graphite for each $cm^3$ of the gel mixture. By adding more graphite, a thicker mixture with higher conductivity is obtained. Graphite concentrations toward the higher end of the 1.2–1.5 gm range have been experimentally found to be preferable because they plated faster. Their higher viscosity, however, was found to be sometimes troublesome when attempting to align the fiber tube 20 after it came in contact with the gel. A graphite concentration of 1.4 gm of graphite per $cm^3$ was experimentally determined to be the best compromise between gel viscosity and plating speed.

The surface of copper base 13 is machined to form an annular region 26 (seen in FIG. 2) for receiving the sidewall of a cylindrical teflon container 27 which serves as the receptacle for the plating solution during the electroplating of the tube 20, the nodes 24 and 25, and the base 13. The matching teflon container 27 is machined to give a snug fit into the annular copper ring region 26. Also, two archways 28 are machined out of the sidewall of the teflon container 27 in its bottom edge at diametrically opposed radial points. Section-line 35 in FIG. 1 shows the perspective of FIG. 3. FIG. 3 shows the side view of the container 27, the base 13, fiber 19, tube 20 and archway 28. The opposing machined-out archways 28 enable the container 27 to be disposed into the ring region 26 and over the copper tube 20 to permit the tube containing the fiber to enter and exit the plating solution region formed by the sidewall of container 27 and the base 13 on which container 27 sits. These entrance and exit ports 28 are sealed with a nonconductive gel. A thin layer of vacuum grease may be used around the bottom edge of container 27 to ensure a liquid-tight seal between the container 27 and the base 13, although it is generally not required if the fit of container 27 is made properly.

The nonconductive gel used as a sealant can have as its base component the aforenoted Sylgard 527 silicone dielectric gel from Dow Corning Corporation. In order to make this gel, which is a two-part mixture, more amenable for use as a sealant, additives are used with the gel in its initial, uncured state to make it a more viscous but still sticky substance that can readily be applied as a sealant. Specifically, 0.06 gm of milled cotton fiber for each $cm^3$ of the two-part gel mixture has been found to be a desirable thickening agent that enables the mixture to be applied immediately as a sealant, but still remain flexible even after full curing over a 24 hour period.

After container 27 is mounted onto the base 13 over the tube 20 and the ports 28 are sealed with the nonconductive gel, the container 27 is filled with a plating solution 30. Before, however, the plating process is initiated, the alignment between the fiber tube 20 and the laser 11 is reoptimized for maximum power coupling by adjusting the position of the tube by means of the micropositioner (not shown) which is connected by clamping arm 23 to the tube 20. A copper anode 31 is inserted into the solution 30, with the fiber tube 20, the nodes 24 and 25, and the base 13 forming the cathode of the plating circuit. The anode 31 and the cathode are electrically connected to a source of DC current (not shown).

Once current is applied, the plating process begins and two types of plating occur. First, there is plating directly on copper, i.e., on the base 13 and the tube 20 carrying the fiber; and second, there is plating on the nodes 24 and 25 of the conducting gel used to establish the electrical bridge between the two copper surfaces. It is well known that plated layers need not be structurally identical to the substrates, and differences in lattice constants manifest themselves in a distortion of the structure if the substrate is not rigid, and in a built-in stress if the substrate is rigid. A further complication arises due to the fact that the electroplated metal changes its structural properties in the course of deposition due to such factors as variations of chemical composition or change in dislocation density. These phenomens lead to two types of stress, the so-called induced stress due to a lattice mismatch relative to the substrate, and the intrinsic stress arising from internal changes in the plated metal. In the plating structure of FIG. 1, both of these stresses would be expected. The intrinsic stress should arise in plating over the flexible nodes, 24 and 25, of conductive gel, while both stresses may arise in plating over copper onto the tube 20 and the base 13. In order to reduce these stresses which could otherwise cause a displacement of the fiber position during the plating procedure and a resultant decrease in the power coupled to the fiber, a low-stress plating solution 30 is used. The low-stress copper plating solution consists of a standard copper sulphate plating bath with a phenol-sulphonic acid additive used as a stress reducing agent.

Plating is continued until there is a sufficient build-up of metal to lock the tube 20 into place on the base 13. After plating is completed, the plating solution 30 is drained and the container 27 is removed. Any grease or nonconductive gel left remaining on the package can be cleaned-off.

The use of a low-stress plating solution in a temperature controlled stable environment in an experimental procedure resulted in a net motion of the fiber of less than 1 μm. As such, the power coupled between the electrooptical device and the fiber remained substantially constant once they were aligned with each other in an optimum coupling arrangement and as the plating process proceeded.

Figure 4:
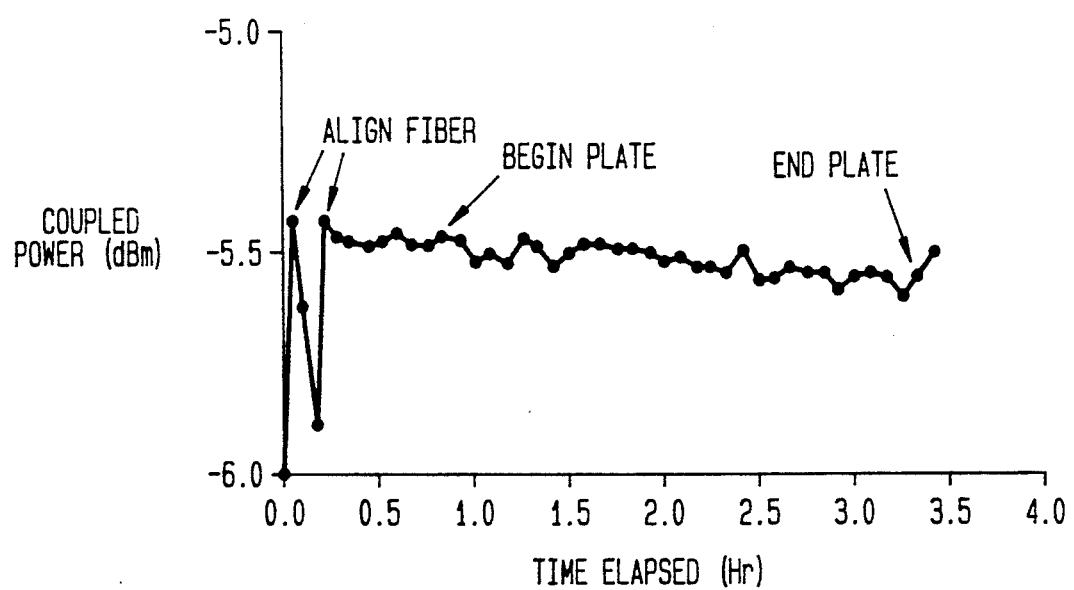
FIG. 4 shows the coupled power from a laser diode to a single mode fiber during the fiber plating procedure as measured in an experimental setup of the invention.

In an experimental setup of a laser transmitter package in accordance with the present invention in which the electrooptical device coupled to a fiber included a laser diode and a spherical YIG lens, the power coupled to a single-mode fiber was measured as a function of time prior to, during, and after the plating process. FIG. 4 shows the power coupled from the laser diode/lens combination into a single mode fiber as a function of time. The initial coupled power before the plating preparations took place was measured as −5.25 dBm. The entire copper base was mounted on a TE cooler, and a thermistor mounted on the chip carrier to which the laser and lens were mounted indicated the temperature to be stable at 20° C. After applying the conductive gel, the teflon container, and the plating solution, the fiber was realigned to an optimum coupling of −5.44 dBm. Due to the viscosity of the plating and sealing gels and the flexibility of the fiber tube and clamping arrangements, there was evidence of drag on the fiber tube, which necessitated several corrections before the alignment stabilized. After the coupling stabilized, the plating current was turned on to $\approx 2.2$ A—m$^{-2}$ for 2½ hours. The plating rate was approximately 150 μm—hr$^{-1}$. There was no indication that the plating process caused any motion of the fiber tube. There is a slight negative slope to the coupled power versus time curve which does not change when the plating current was applied. This resulted in a change of 0.1 dB net coupling which corresponds to 0.7 μm of lateral displacement. Inasmuch as the output power from the laser itself was not directly monitored during the fiber-locking process, the stability of the current source and laser temperature were very important. The current source was stable to 0.004 mA (corresponding to $\approx 0.01$ -dB optical output power) and the temperature of the chip carrier was controlled to ±0.1° C. Periodic monitoring of the coupled power over a 48 hour period after the fiber was locked into place indicated a further 0.1 dB decrease. Thus, some portion of the initial 0.1 -dB coupling change could possibly be attributed to laser output power variation.

The performance of the laser transmitter package demonstrated the excellent potential of the present invention for precise fiber fixing applications. No evidence was observed that the plating process itself resulted in any fiber motion greater that $\approx 1$ μm. Several variables need to be controlled in order to maintain stable alignment during the plating process. Drifts in the micromanipulator stage, viscous drag on the flexible fiber-carrying copper tube, clamping effects, and temperature variations must all be controlled to fix and maintain alignment until the plating process locks in. Evidence is that it takes 15-20 min for this to occur. There is also evidence that, during this critical period, and even after plating begins to lock the fiber, alignment can still be optimized to overcome any drifting problems.

Although described in conjunction with the packaging of an optical fiber and an electrooptical device, the principles of the present invention can be applied to permanently fix the position of any object relative to another object. For example a first metallic object, or a non-metallic object which is permanently affixed to an outer-surface that is metallic at least in part on its bottom portion, can be positioned in a desired location on a metallic base. Specifically, the object is positioned on the base by means of a bridge of a conducting gel placed in contact between the base and the metallic bottom portion of the object, thereby electrically connecting the object, the base and the gel. A bottomless container is then placed around the structure of base, gel and object and a low-stress plating bath is introduced into the container to a height above the gel. An anode is placed in the bath and the position of the object may be readjusted, if necessary, before the application of current between the anode and the cathode, the latter consisting of the base, gel and object. During the initial stages of plating, further adjustment of the position of the object can be made without affecting the process because the gel is conducting in its bulk, not just on the surface. A minor shift in the gel position thus merely introduces a small portion of new gel to be plated.

The above-described embodiments are illustrative of the principles of the present invention. Various other embodiments could be devised by those skilled in the art without departing from the spirit and scope of the invention.

What is claimed is:

1. An electrooptical device and optical fiber package comprising:
   an electrooptical device;
   an optical fiber;
   a common substantially planar metallic base onto which said electrooptical device is mounted;
   a metallic tubular fiber support member into the core of which one end of said optical fiber is mounted;
   at least one node of flexible electrically conductive gel;
   said fiber support member connected to said base through said at least one node of flexible electrically conductive gel and closely positioned with said device so that said fiber end within said member and said device are in light coupling alignment, said fiber support member being connected longitudinally along its exterior metallic sidewall to said base, said support member is on top of and substantially parallel to said base:
   a layer of metal electrolytically deposited onto said fiber support member, said at least one node of electrically conductive gel, and said base to a thickness sufficient to physically maintain said support member, said at least one node, and said base together and said fiber within said member and said electrooptical device in said light coupling alignment.

2. A package in accordance with claim 1 wherein said electrooptical device comprises a semiconductor laser.

3. A package in accordance with claim 2 wherein said electrooptical device further comprises an optical lens.

4. A package in accordance with claim 2 wherein said electrooptical device further comprises an optical isolator.

5. A package in accordance with claim 2 wherein said electrooptical device further comprises an optical filter.

6. A package in accordance with claim 1 wherein said electrically conductive gel is a mixture of a stable organic material and graphite particles.

7. A package in accordance with claim 1 wherein said electrically conductive gel is a mixture of a curable silicone dielectric composition and graphite particles.

8. A package in accordance with claim 7 wherein said graphite particles have about a 2-$\mu$m diameter and have a concentration of between 1.2 gm and 1.5 gm of graphite for each $cm^3$ of said silicone dielectric composition.

9. A package in accordance with claim 8 wherein the concentration of graphite particles is about 1.4 gm of graphite for each $cm^3$ of said silicone dielectric composition.

10. A package in accordance with claim 1 wherein said optical fiber is mounted in the bore of said support member by means of epoxy.

11. A package in accordance with claim 1 further comprising a chip carrier, said electrooptical device being mounted on said chip carrier and said chip carrier being mounted on said base.

12. A package in accordance with claim 1 wherein said base, said support member, and said layer of metal are copper.

13. A method of packaging an electrooptical device and an optical fiber in light coupling alignment with each other, said method comprising the steps of:
    affixing said electrooptical device on a metallic base;
    affixing said optical fiber within the bore of a metallic tubular support member;
    attaching said support member on said base with at least one node of a flexible electrically conductive gel and positioned so that said device and said optical fiber within said support member are in light coupling alignment;
    disposing a non-metallic bottomless container on said base and over at least the portion of said support member to which said at least one node of conductive gel attaches said member to said base, a liquid-tight region being formed by the interior sidewalls of said container and said base;
    adding an electrolytic plating solution into the liquid-tight region of said container;
    inserting into said plating solution an anode in an electrolytic plating circuit;
    electrically connecting said interconnected base, said support member, and said at least one node of conductive gel as the cathode in said electrolytic plating circuit;
    applying sufficient plating current to said circuit to deposit a layer of metal onto said support member, said at least one node of electrically conductive gel, and said base to a thickness sufficient to physically maintain said support member, said at least one node, and said base together and said fiber within said member and said electrooptical device in light coupling alignment;
    draining said plating solution from within said container; and
    removing said container from said base.

14. The method in accordance with claim 13 wherein said plating solution is a low-stress plating solution.

15. The method in accordance with claim 13 further comprising the step of realigning the fiber support member and the device for maximum light coupling before applying said plating current to said circuit.

16. The method in accordance with claim 15 further comprising the step of realigning the fiber support member and the device for maximum light coupling after plating begins but before the plating locks the support member in place.

17. The method in accordance with claim 13 wherein said flexible electrically conductive gel is a mixture of a stable organic material and graphite particles.

18. A method of fixing an object in position on a metallic base, the object having an outer surface to be affixed to the base that is at least in part metallic comprising the steps of:
    attaching at least a portion of the metallic outer surface of said object to the base with a bridge of a flexible electrically conductive gel;
    disposing a non-metallic bottomless container on the base and over at least the portion of the object attached to the base by means of the bridge of the flexible electrically conductive gel, a liquid-tight region being formed by the interior sidewalls of the container and the base;
    adding an electrolytic plating solution into the liquid-tight region of the container;
    inserting into the plating solution an anode in an electrolytic plating circuit;
    applying sufficient plating current to the plating circuit to deposit a layer of metal onto the base, to the metallic outer surface of the object that is within the plating solution, and to the bridge of electrically conductive gel that is in contact with the plating solution, the layer of metal being of a thickness sufficient to physically maintain the object and the base together;

draining the plating solution from within the container; and removing the container from the base.

19. The method in accordance with claim 18 wherein the plating solution is a low-stress plating solution.

20. The method in accordance with claim 19 further comprising the step of adjusting the position of the object on the base before applying the plating current to the plating circuit.

21. The method in accordance with claim 20 further comprising the step of readjusting the position of the object on the base after plating begins but before the plating locks in place the position of the object on the base.

22. The method in accordance with claim 18 wherein the flexible electrically conductive gel is a mixture of a stable organic material and graphite particles.

23. An electrooptical device and optical fiber package comprising:

an electrooptic device;

an optical fiber;

a common metallic base onto which said electrooptical device is mounted, said base having a machined-out region shaped for supporting the sidewall or sidewalls of a bottomless container for holding an electrolytic plating solution;

a metallic tubular fiber support member into the bore of which one end of said optical fiber is mounted;

at least one node of flexible electrically conductive gel;

said fiber support member connected to said base through said at least one node of flexible electrically conductive gel and closely positioned with said device so that said fiber end within said member and said device are in light coupling alignment;

a layer of metal electrolytically deposited onto said fiber support member, said at least one node of electrically conductive gel, and said base to a thickness sufficient to physically maintain said support member, said at least one node, and said base together and said fiber within said member and said electrooptical device in said light coupling alignment.

* * * * *